(12) United States Patent
Ferrante et al.

(10) Patent No.: US 8,014,208 B1
(45) Date of Patent: Sep. 6, 2011

(54) ERASE VERIFICATION FOR FLASH MEMORY

(75) Inventors: Gianfranco Ferrante, Naples (IT); Dionisio Minopoli, Naples (IT); Angelo Avino, Naples (IT)

(73) Assignee: Micron Technology, Inc., Boise, ID (US)

( * ) Notice: Subject to any disclaimer, the term of this patent is extended or adjusted under 35 U.S.C. 154(b) by 52 days.

(21) Appl. No.: 12/357,940

(22) Filed: Jan. 22, 2009

(51) Int. Cl.
*G11C 11/34* (2006.01)

(52) U.S. Cl. ......... 365/185.22; 365/185.05; 365/185.09; 365/185.11; 365/185.29; 365/185.33

(58) Field of Classification Search ............. 365/185.22, 365/185.05, 185.09, 185.11, 185.29, 185.33
See application file for complete search history.

(56) References Cited

U.S. PATENT DOCUMENTS

| | | | |
|---|---|---|---|
| 2004/0240268 A1* | 12/2004 | Kim et al. | 365/185.09 |
| 2005/0248991 A1* | 11/2005 | Lee et al. | 365/185.28 |
| 2008/0117688 A1* | 5/2008 | Park et al. | 365/185.22 |

OTHER PUBLICATIONS

MX25L1635D Datasheet, Macronix International Co., Ltd., Rev. 1.3, 50 pages, Jul. 8, 2008.
W25Q80, W25Q16, W25Q32 Winbond Spiflash, Preliminary—Revision B, 61 pages, Sep. 26, 2007.
Serial Quad I/O (SQI) Flash Memory SST26VF016/SST26VF032, Silicon Storage Technology, Inc., 34 pages, Apr. 2008.

* cited by examiner

*Primary Examiner* — Hoai V Ho
*Assistant Examiner* — Fernando N Hidalgo
(74) *Attorney, Agent, or Firm* — Berkeley Law & Technology Group, LLP

(57) ABSTRACT

Example embodiments for verifying an erase operation for a flash memory device may comprise, for one or more embodiments, utilizing program operation verification circuitry to verify, at least in part, the erase operation.

18 Claims, 6 Drawing Sheets

ERASE VERIFICATION FOR FLASH MEMORY

BACKGROUND

Subject matter disclosed herein may relate flash memory devices, and may relate more particularly to verifying erase operations for flash memory devices.

Non-volatile memory devices, including flash memory devices, may be found in a wide range of electronic devices. In particular, flash memory devices may be used in computers, digital cameras, cellular telephones, personal digital assistants, etc. For many applications, flash memory devices may store instructions to be executed on a processor, and in at least some of these applications, the processor may fetch instructions from the flash memory devices, such as, for example, in execute-in-place (XiP) implementations. For other applications, flash memory devices may be used in solid state mass storage devices. For these applications and more, efficient and accurate erase verification techniques may comprise important aspects of flash memory reliability and/or performance.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Figure 1:
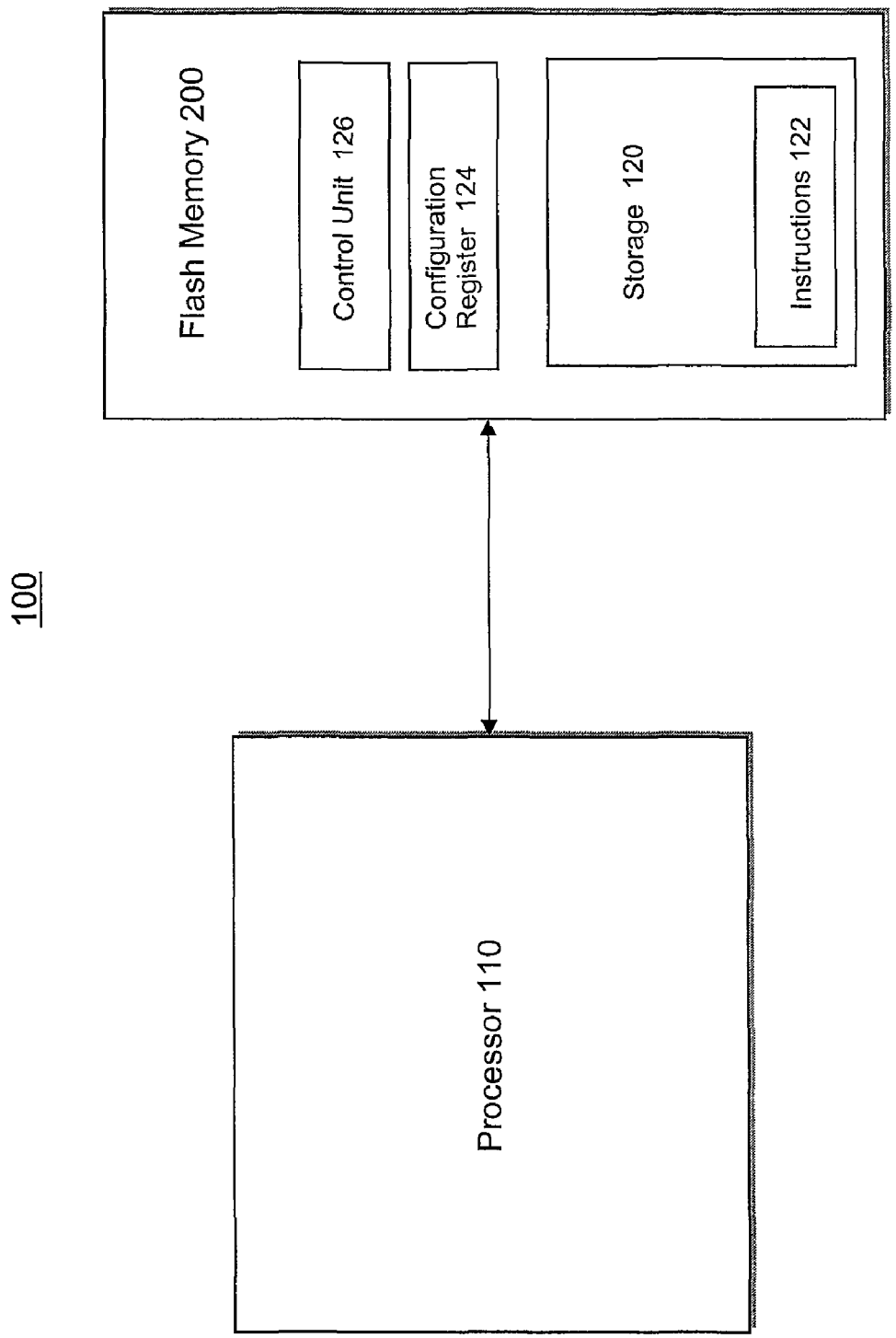
FIG. 1 is a block diagram of an example embodiment of a computing platform including a serial flash memory device.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized. Furthermore, structural or logical changes may be made without departing from the scope of claimed subject matter. It should also be noted that directions or references, for example, up, down, top, bottom, and so on, may be used to facilitate discussion of the drawings and are not intended to restrict the application of claimed subject matter. Therefore, the following detailed description is not to be taken to limit the scope of claimed subject matter or their equivalents.

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, methods, apparatuses or systems that would be known by one of ordinary skill have not been described in detail so as not to obscure claimed subject matter.

Reference throughout this specification to "one embodiment" or "an embodiment" may mean that a particular feature, structure, or characteristic described in connection with a particular embodiment may be included in at least one embodiment of claimed subject matter. Thus, appearances of the phrase "in one embodiment" or "an embodiment" in various places throughout this specification are not necessarily intended to refer to the same embodiment or to any one particular embodiment described. Furthermore, it is to be understood that particular features, structures, or characteristics described may be combined in various ways in one or more embodiments. In general, of course, these and other issues may vary with the particular context of usage. Therefore, the particular context of the description or the usage of these terms may provide helpful guidance regarding inferences to be drawn for that context.

Likewise, the terms, "and," "and/or," and "or" as used herein may include a variety of meanings that also is expected to depend at least in part upon the context in which such terms are used. Typically, "or" as well as "and/or" if used to associate a list, such as A, B or C, is intended to mean A, B, and C, here used in the inclusive sense, as well as A, B or C, here used in the exclusive sense. In addition, the term "one or more" as used herein may be used to describe any feature, structure, or characteristic in the singular or may be used to describe some combination of features, structures or characteristics. Though, it should be noted that this is merely an illustrative example and claimed subject matter is not limited to this example.

Some portions of the detailed description which follow are presented in terms of algorithms or symbolic representations of operations on data bits or binary digital signals stored within a computing platform memory, such as a computer memory. These algorithmic descriptions or representations are examples of techniques used by those of ordinary skill in the data processing arts to convey the substance of their work to others skilled in the art. An algorithm here, and generally, is considered to be a self-consistent sequence of operations or similar processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a computing platform, such as a computer or a similar electronic computing device, that manipulates or transforms data represented as physical electronic or magnetic quantities within memories, registers, or other information storage devices, transmission devices, or display devices of the computing platform. Further, unless specifically stated otherwise, processes described herein, with reference to flow diagrams or otherwise, may also be executed and/or controlled, in whole or in part, by such a computing platform.

Flash memory may be characterized at least in part by the ability to be electrically erasable and programmable, and may be utilized in a very wide range of electronic device types, including, but not limited to, digital cameras, cellular telephones, personal digital assistants, portable navigation devices, portable music players, notebook computers, desktop computers, etc., to name but a few examples. As discussed above, for these applications and others, efficient and accurate erase verification techniques may comprise important aspects of flash memory reliability and/or performance. Also, as flash memory densities increase, improved performance of erase verification operations may continue to increase in importance in order to ensure reliable and efficient performance of flash memory devices, particularly for those flash memory devices offering distinct commands to perform erase operations and erase verification operations.

For one or more embodiments, circuitry designed for program verification operations may be utilized to perform, at least in part, erase verification operations. The use of the program verification circuitry to perform erase verification operations may provide an efficient technique for verifying erase operations, thereby helping to improve the overall performance of flash memory systems. Example embodiments utilizing program verification circuitry to perform erase verification operations are described below. However, the embodiments disclosed herein are merely examples, and the scope of claimed subject matter is not limited in this respect.

FIG. 1 is a block diagram of an example embodiment of a computing platform 100, comprising a processor 110 and a flash memory device 200. For one or more embodiments, flash memory 200 may comprise a control unit 126 and a configuration register 124. Memory 200 may also comprise a storage area 120 comprising a plurality of memory cells. Further, memory 200 may store instructions 122 that may comprise code for any of a wide range of possible operating systems and/or applications. The instructions may be executed by processor 110. Note that for this example, processor 110 and memory 200 are configured as an execute-in-place (XiP) type implementation, where processor 110 may fetch instructions directly from flash memory 200.

For one or more embodiments, control unit 126 may receive one or more signals from processor 110 and may generate one or more internal control signals to perform any of a number of operations, including data read operations, by which processor 110 may access instructions 122, for example. As used herein, the term "control unit" is meant to include any circuitry or logic involved in the management or execution of command sequences as they relate to flash memory devices. Memory 200 may also perform program and erase operations, as well as operations to verify the program operations, as well as the erase operations.

The term "computing platform" as used herein refers to a system or a device that includes the ability to process or store data in the form of signals. Thus, a computing platform, in this context, may comprise hardware, software, firmware or any combination thereof. Computing platform 100, as depicted in FIG. 1, is merely one such example, and the scope of claimed subject matter is not limited in these respects. For one or more embodiments, a computing platform may comprise any of a wide range of digital electronic devices, including, but not limited to, personal desktop or notebook computers, high-definition televisions, digital versatile disc (DVD) players or recorders, game consoles, satellite television receivers, cellular telephones, personal digital assistants, mobile audio or video playback or recording devices, and so on. Further, unless specifically stated otherwise, a process as described herein, with reference to flow diagrams or otherwise, may also be executed or controlled, in whole or in part, by a computing platform. For the example embodiments described herein, computing platform 100 may comprise a cellular telephone, although again, the scope of claimed subject matter is not so limited.

Although the example of FIG. 1 comprises a computing platform, flash memory devices may be incorporated into any number of other types of electronic devices. For example, flash memories may also be employed, for example, in solid-state storage devices such as memory sticks, Universal Serial Bus (USB) flash drives, memory cards, etc., to name but a few examples.

For one or more embodiments, flash memory device 200 may comprise a NAND flash memory device. NAND flash memories may comprise a matrix of memory cells that may be organized into sectors or blocks, and a set of circuits that may be referred to as page buffers. Page buffers may be used to read and/or write information from and/or to the memory cells. For an embodiment, the matrix of memory cells may be thought of as a single column or as multiple vertical columns of blocks. A device organized as a single column of memory blocks may be referred to as a single plane device, while a device organized as more than one column of blocks may be referred to as a multi-plane device. Also, a single level cell (SLC) flash memory device may refer to a memory device where an individual memory cell stores a single bit of information, while a multilevel cell (MLC) flash memory device may refer to a memory device wherein an individual memory cell stores more than one bit of information.

For at least some embodiments of NAND flash memory devices, read and write operations to and from the matrix of cells may be accomplished on a per-page basis, wherein a page comprise a number of cells. A page may comprise, for an example embodiment, 512+16 bytes (small page, or SP), or 2048+64 bytes (large page, or LP) of data. Flash memory devices may generally be classified as small page or large page devices. However, these are merely example flash memory devices, and the scope of claimed subject matter is not limited in this respect. For the embodiments described herein, flash memory devices may comprise SLC LP devices, where a page may comprise (2048+64)*8=16896 memory cells. Of course, this merely represents an example flash memory device, and the scope of claimed subject matter is not limited in this respect. For example, for one or more embodiments, the techniques described herein may also be applied to MLC devices, thereby resulting in significant advantages for memory devices that provide distinct erase and erase verify commands.

Also for one or more embodiments, memory cells contained in a block of memory may be connected to one another in a string of thirty-two in-series transistors. The string of transistors may be connected at one end to a bit-line. A "bit-line" may refer to a strip of metal running vertically over the matrix of cells which may allow connection of the strings of cells for the various blocks of memory in a plane to a node coupled to a page buffer. For an example embodiment, a block of cells may comprise sixty-four pages divided into two groups of thirty-two organized into thirty-two rows, referred to as "word-lines" (WL). For an embodiment, a pair of pages (even and odd) may be placed on the same word-line, which may comprise a long strip of metal running horizontally across the matrix of cells, for this example, connecting all of the gates of all of the memory cells of the above mentioned pair of pages. Therefore, a total of 33,792 bit-lines (16896 associated with the individual pages of the same word-line) may be placed adjacent to one another running across the matrix of memory cells, with the bit-lines running in a vertical direction, for the present example. The various pairs of even and odd bit-lines are coupled to a plurality of page buffers, with individual pairs of bit-lines sharing page buffers.

For one or more embodiments, page buffers may comprise circuits that may store bits of information read from a page of memory cells for a read operation or bits of information that have been inserted from another system component, such as processor 110, to be programmed into the page of memory cells.

For one or more embodiments, page buffers may be connected to bit-lines and/or strings of flash memory cells in one or more blocks of the matrix that are not operational, or "damaged" or "broken" in other words, for various reasons. These page buffers and associated bit-lines and strings of memory cells may be substituted with others available for this purpose. Such an operation may be referred to as a column redundancy substitution, and spare page buffers and associated bit-lines and strings of flash memory cells may be referred to as redundancy resources. Information that may be used to substitute broken page buffers and associated bit-lines and strings of memory cells with the spare ones may be referred to as redundancy information, and such information may be stored in one or more registers.

Figure 2:
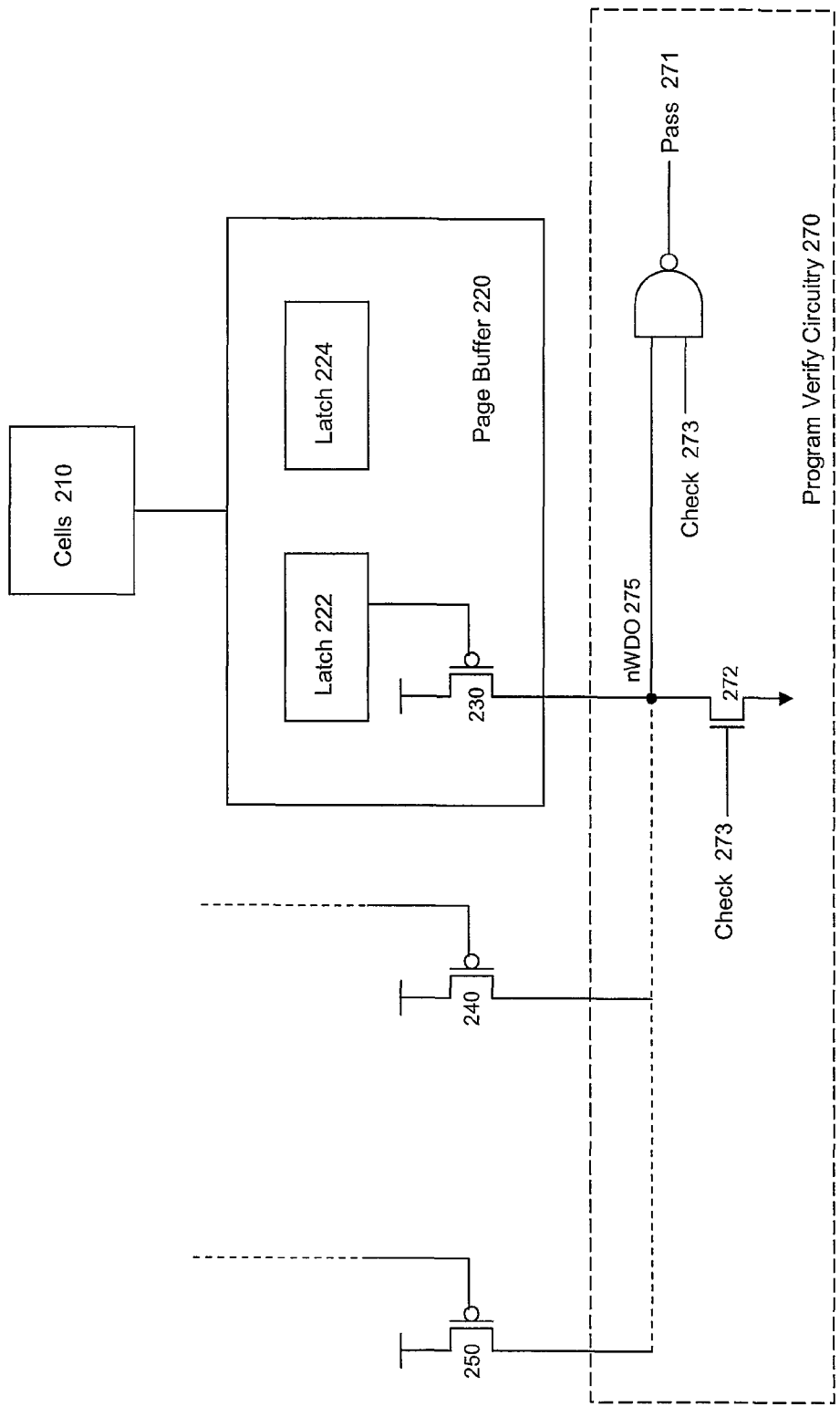
FIG. 2 is a diagram depicting an example embodiment of a flash memory device including example program verification circuitry.

FIG. 2 is a diagram depicting an example embodiment of flash memory device 200 including example program verification circuitry 270. FIG. 2 depicts a bock of cells 210 coupled to a page buffer 220, wherein page buffer 220 comprises a pair of latches 222 and 224. In general, for one or more embodiments, latches 222 and 224 may be used to store information read from cells 210 and/or written to cells 210. In the case of an erase verify operation, latches 222 and 224 may be used to store information related to whether cells 210 have been erased. If cells 210 have been erased, the signal from latch 222 to PMOS transistor 230 is not asserted, for one or more embodiments. Transistors 240 through 250 are also depicted in FIG. 2, and these transistors represent erase verification results from a number of other page buffers (not shown). If any of the signals to the gates of transistors 230 through 250 become asserted due to an incomplete erasure of cells associated with the various page buffers, node 275 may be pulled to a logically high voltage level, and if a Check signal 273 is also asserted, a Pass signal 271 becomes de-asserted to indicate that the erase operation failed. That is, Pass signal 271 becomes de-asserted if any of the cells 210 are not erased.

On the other hand, if none of transistors 230-250 are turned on by any of the page buffers, transistor 272 of program verify circuitry 270 pulls node 275 to a logically low voltage level if Check signal 273 is asserted, and Pass signal 271 becomes asserted to indicate a validation of the erase operation. That is, an assertion of Pass signal 271 indicates that all of cells 210 have either been erased and/or that any page buffers associated with damaged or stuck cells have been identified as redunded and not taken into account in computing a value for Pass signal 271. Pass signal 271, in other words, may indicate a pass/fail condition related to the verification of the erase operation of operational flash memory cells in a block of the matrix.

In the discussions that follow, the focus is on operations involving individual page buffers in order to more clearly explain intended subject matter. However, for a number of embodiments, the operations described may be performed by a plurality of page buffers, and it is the combined results from the plurality of page buffers that determines the success/failure of an erase operation, as previously described for example in connection with FIG. 2.

In general, for one or more embodiments, a value specifying whether a page buffer is a redunded page buffer may be stored in a first latch of the page buffer. One or more bit lines associated with the page buffer may be sensed in order to determine whether a number of memory cells coupled to the one or more bit lines have been erased. A value indicating whether the memory cells have been erased may be stored in a second latch of the page buffer. The value from the second latch may be transferred to the first latch, and in response to the transfer the value stored in the first latch represents an erase verification value and/or represents a value identifying the page buffer as a redunded page buffer. As previously mentioned, these operations may be performed at a number of page buffers, and the overall block erase verification pass/fail status, taking into account redunded page buffer information may be evaluated using a combinatorial circuit also used for program verification operations to generate an erase operation verification pass/fail signal. By using the combinatorial circuitry designed for program operation verification operations to perform erase verification operations, an increase in efficiency may be achieved over other solutions that may require the scanning of a relatively large number of values read from the various page buffers. Thus, the amount of time required to perform erase verification operations may be reduced, providing an increase in overall system performance.

Figure 3:
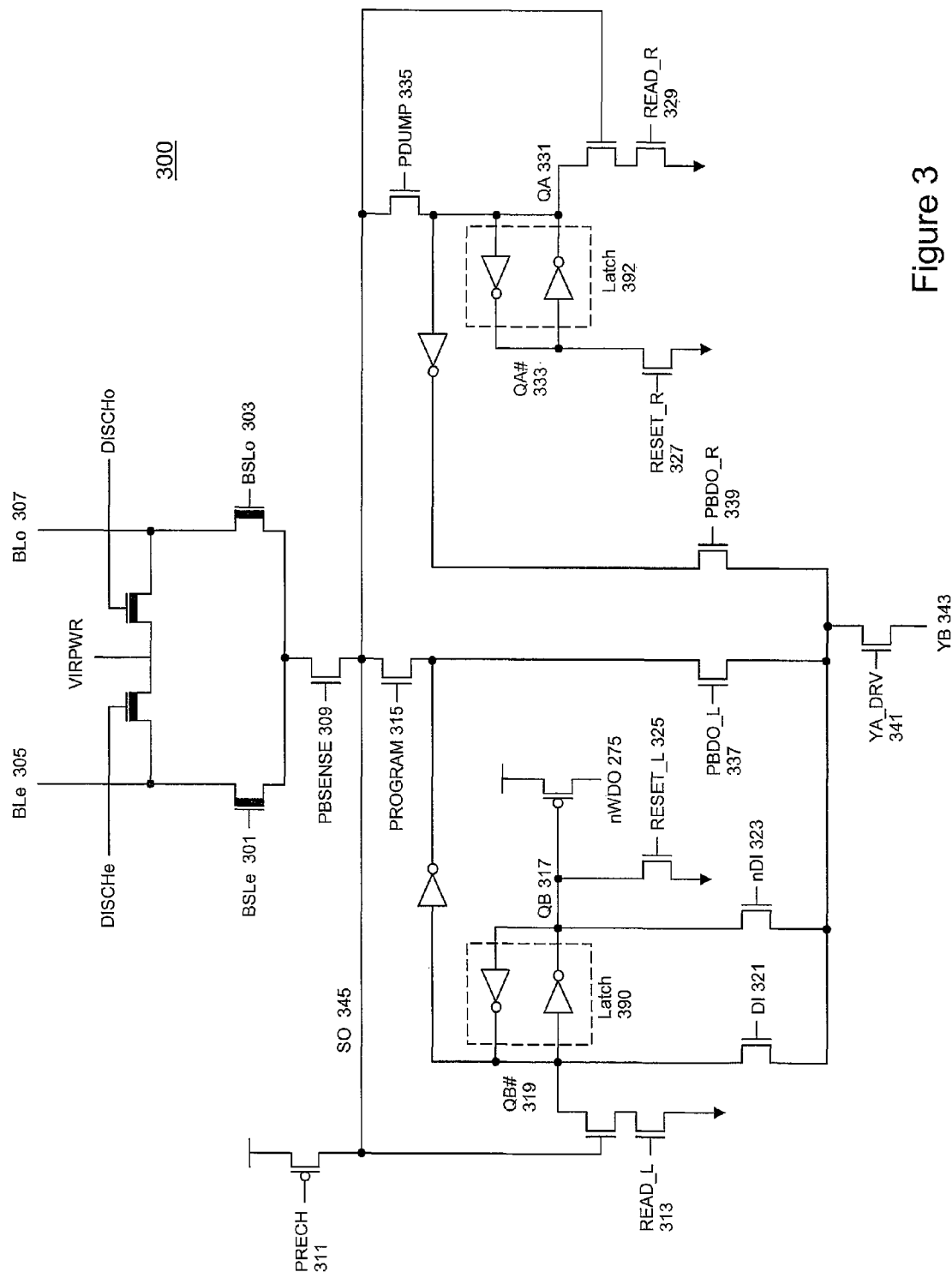
FIG. 3 is a schematic diagram of an example flash memory page buffer.
Figure 4:
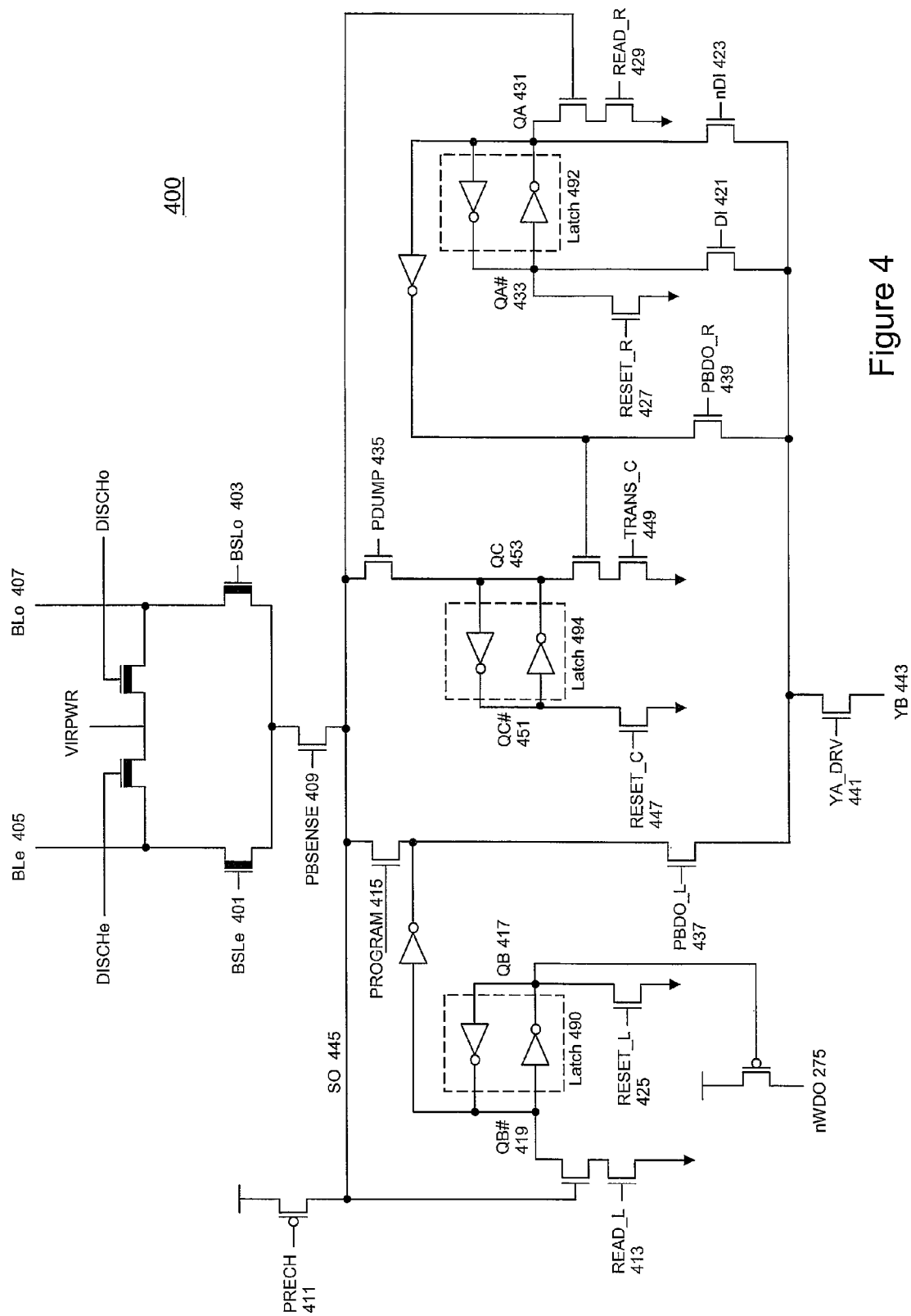
FIG. 4 is a schematic diagram of an alternative example flash memory page buffer.
Figure 5:
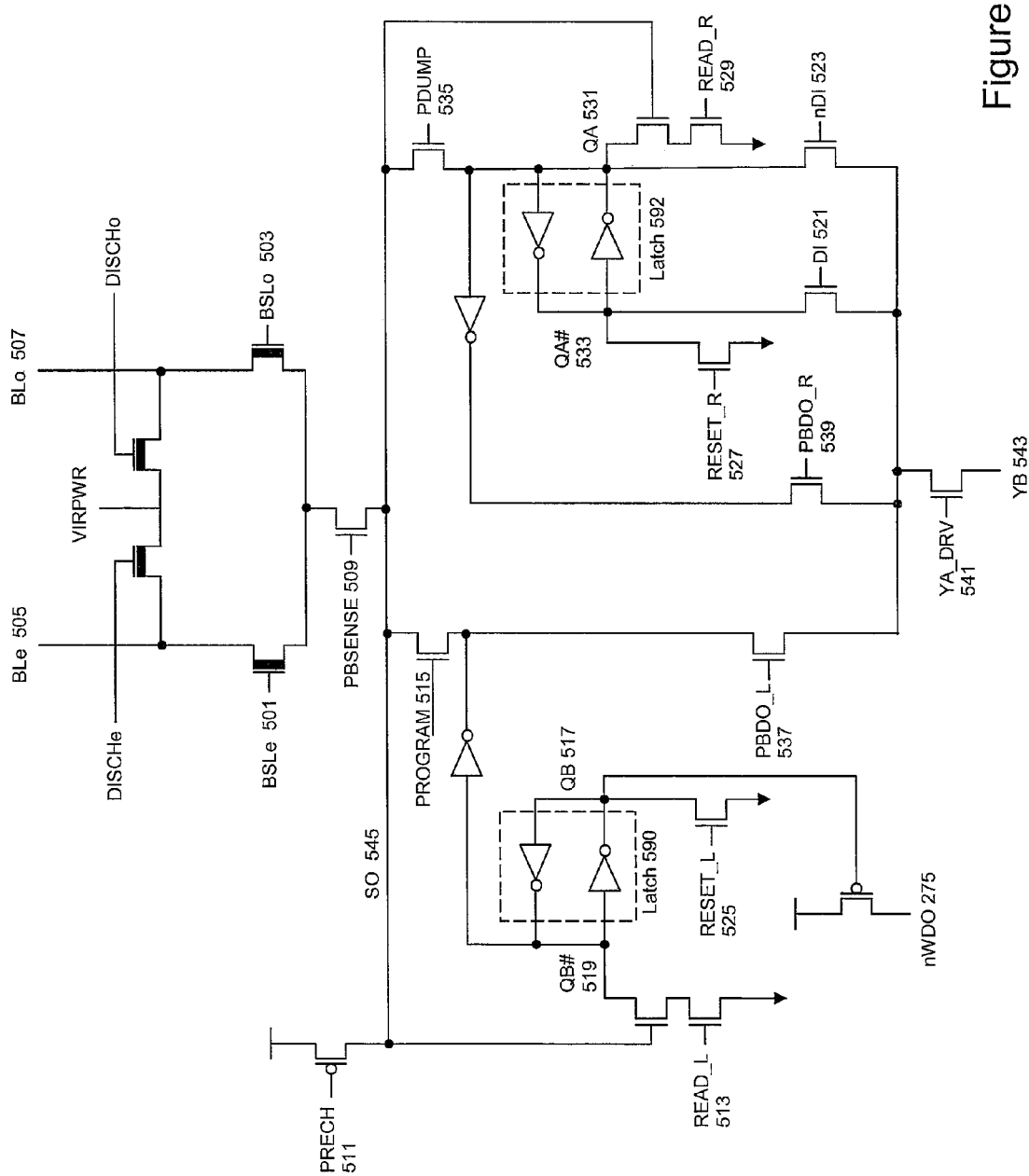
FIG. 5 is a schematic diagram of an additional example flash memory page buffer.

FIGS. 3-5, discussed below, depict several example embodiments of page buffers that may be used in erase verification operations. Although the examples described herein provide various details relating to various possible implementations, it should be noted that the embodiments disclosed herein are merely examples, and that the scope of claimed subject matter is not limited to the specific details described in connection with these example embodiments.

FIG. 3 is a schematic diagram of an example flash memory page buffer 300 comprising a latch 390 and a latch 392. Page buffer 300 may be incorporated into any of a wide range of flash memory device types, including for one example flash memory 200 depicted in FIG. 1. Page buffer 300 for this example embodiment is associated with and coupled to a pair of bit lines BLe 305 (even bit-line) and BLo 307 (odd bit-line). Although two bit lines are depicted, the scope of claimed subject matter is not limited in this respect, and other numbers of bit lines may be associated with a page buffer, for other embodiments. Latches 390 and 392 may be utilized to store information that may be read from and/or that may be written to one or more memory cells coupled to one or more of bit lines 305 and 307. To perform a program operation, data from an external component such as processor 110 for example may be stored at latch 390, and the data may be used to program one or more memory cells coupled to one or more of bit lines 305 and 307. For page buffer 300, data may be inserted by way of signals DI 321 and nDI 323. Signal nDI 323 is a complement of signal DI 321, for one or more embodiments. By asserting either DI 321 or nDI 323, one of nodes QB# 319 or QB 317 may be pulled to a logically low voltage level through by signal YB 343 if signal YA_DRV 341 is asserted. If node QB# 319 is pulled to a logically low voltage level, node QB 317 will be at a logically high voltage level. Latch 390 may maintain the states of nodes QB#319 and QB 317 until a change of state transpires.

To perform a program verification operation, a value indicating that the memory cell was correctly programmed may be present at node QB 317. If node QB 317 is at a logically high voltage level, for this example, node nWDO 275 is not pulled to a logically high voltage level, and nWDO may be pulled to a logically low voltage level by transistor 272, depicted in FIG. 2, upon an assertion of Check signal 273. If all of the page buffers coupled to node nWDO 275 similarly allow node nWDO 275 to be pulled to the logically low voltage level, Pass signal 271 may be asserted, indicating a successful programming operation. As disclosed above, program verify circuitry 270 may also be utilized to perform, at least in part, erase verification operations, described more fully below.

For one or more embodiments, if a page buffer such as buffer 300 is coupled to damaged and/or stuck memory cells and/or bit lines, the damaged cells and/or bit lines and their associated page buffers may be substituted for by a spare page buffer and spare bit lines and associated memory cells. The substitution of page buffers may be managed by dedicated logic that may substitute data from substituted, or redunded, page buffers with data from substitute spare page buffers. For an embodiment, the dedicated logic may also, if performing a data insertion for a program operation, for example, store in damaged page buffers a value indicating that the damaged page buffers are redunded, and the dedicated logic may also steer the data to be inserted to substitute page buffers prior to programming memory cells.

To perform a read operation for a single page of memory, for one or more embodiments, latch 390 and/or latch 392 may be reset by an assertion of RESET_L signal 325 and/or RESET_R 327. The bit-line corresponding to the addressed page (either even or odd for the present example) may be pre-charged. For an example, bit-line BLe 305 may be pre-charged by asserting signal PRECH 311 to a logically low voltage level, by asserting signal PBSENSE 309 to a relatively high voltage level, and by asserting signal BSLe 301 to a relatively high voltage level. Also for this example, DISCHe and VIRPWR may be de-asserted to a logically low voltage level. Similar actions may be taken in a number of other page buffers. Upon completion of an evaluation time period during which an addressed memory cell may discharge BLe 305 if the memory cell is erased, BLe 305 may be electrically coupled to node SO 345 by an assertion of PRSENSE 309 at a relatively high voltage level. Node SO 345 may reach the same voltage level as BLe 305 by way of charge sharing. This may be referred to as an evaluation phase. An assertion of READ_L 313 and/or READ_R 329 may cause the value stored at nodes 319 and 331, respectively, to change (these nodes are at logical '1' upon reset) if the value on SO 345 is a logical '1', that is, if the memory cell was not erased, but rather was programmed with a logical '0'.

As will be discussed more fully below, data may be transferred between latches within a page buffer. This characteristic of the page buffer may be used in one or more embodiments to effectuate an erase verification operation, as described in the examples below. Such transfers between latches may be non-inverting, where the data does not change polarity during the transfer, or may be inverting in some cases, where the value of the data is changed from one logical state to another during the transfer.

In some implementations of flash memory devices, to perform a verification of an erase operation, two consecutive read operations may be performed, one per bit-line, wherein the read operations read 32 pages at a time. The read operations may be identical to, the example described above except for the selection of 32 pages to be read concurrently, for an example. The reading of the 32 pages of a bit-line will result in that bit-line being discharged only if all of the 32 memory cells in the string are erased. The results of the read operations may be stored in a latch of the page buffer, with the results of the second read overwriting the results of the first read operation. At the end of the second read operation, the value stored in the latch will be the initial value stored in the latch as a result of the reset pulse if and only if both bit-lines connected to the page buffer have been discharged by completely erased strings of memory cells. Also in some implementations of flash memory devices, after the two readings have been completed, all of the values stored in the page buffer latches may by scanned to check whether all of the latches contain the initial reset value. This may be accomplished in at least some cases by scanning all column addresses and taking, perhaps 64 bits at a time, values to an external circuit that verifies in successive operations that all of the values match the initial reset value. Clearly, the evaluation of all of the values of the page buffer latches after the two read operations is a time-consuming, inefficient process.

In one or more embodiments, the process for verifying an erase operation may make use of program verify circuitry 270, for example, to evaluate all of the values for the various page buffers in a single combinatorial evaluation. The latches in the page buffers may be used to store information identifying redunded page buffers, and the latches may also be used to store information indicating whether memory cells have been erased. The values provided to the combinatorial circuit take into account redunded page buffers so that invalid data from redunded page buffers do not impact the verification results. In short, for an embodiment, a logical '1' may be stored in one of the latches in the plurality of page buffers if a page buffer is a redunded page buffer or if all of the memory cells associated with the page buffer have been determined to be erased. Otherwise, a value of '0' will be stored in the latch indicating that the page buffer is not redunded and that there is one or more memory cell that is not erased. A value of '0' for an example embodiment will cause node nWDO 275 to be pulled to a logical '1', and signal 271 will be dropped to a logically low voltage level upon an assertion of Check 273. The logical '0' on Pass 271 for this example indicates that the erase operation failed. Of course, the logical voltage levels and logical values described herein are merely examples, and the scope of claimed subject matter is not limited in these respects.

Also, although the example embodiments described herein disclose a two-plane memory device with pairs of even and odd bit-lines associated with page buffers, the scope of claimed subject matter is not limited in this respect. For example, other embodiments may incorporate multi-plane flash memory devices. The techniques for performing erase verification operations described herein may be applied to such multi-plane devices, and the time savings realized through the use of such techniques may be particularly significant for multi-plane devices.

Returning attention to page buffer 300 of FIG. 3, an example erase verification operation will be described. As previously mentioned, page buffer 300 comprises two latches, latch 390 and latch 392. For the present example erase verification operation, two latches are utilized, wherein data is input at the same latch whose value controls whether an error condition is signaled on node nWDO 275. An initial reset phase of the erase verification operation may begin for an example embodiment by asserting RESET_R 327, resulting in node QA# 333 being pulled to logical '0'. Node QA 331 is driven to a logical '1'.

A pre-charge phase for BLe 305 may include delivering a relatively low voltage level to PRECH 311, a relatively high voltage level to PBSENSE 309, a relatively high voltage level to BSLe 301, a '0' to DISCHe, a '0' to VIRPWR, and a '1' to DISCHo. During the pre-charge phase, data may be input to latch 390. Node YB 343 may have a value of '0' for selected page buffers in accordance with column decoding. For the present example embodiment, assume that page buffer 300 is not a redunded buffer, but that page buffer 300 and its associated memory cells and bit-lines are assumed to be operational. In the case of a non-redunded page buffer, a '0' is presented to DI 321 and a '1' is presented to nDI 323, resulting in values of '1' and '0' on nodes QB# 319 and QB 317, respectively. In the case of a redunded page buffer, values of '1' and '0' may be presented to DI 321 and nDI 323, resulting in values of '1' and '0' on nodes QB 317 and QB# 319, respectively. In the case of a redunded page buffer, these values would remain on nodes QB and QB#, and no result from any reading of bit lines BLe and BLo would change those values. Thus, for a redunded page buffer, node nWDO 275 would not be pulled to the logically high voltage level by that page buffer.

For an embodiment, an evaluation phase may comprise applying a '0' to PBSENSE 309 and a '0' to BSLe 301. If the memory cells associated with BLe 305 are erased, BLe 305 will be discharged to a relatively low voltage level. If any memory cell is not erased, BLe 305 will remain at a relatively high voltage level, and this condition would indicate a failed erase operation.

A sensing phase for BLe 305 may comprise asserting BSLe 301 and PBSENSE 309, as well as applying a pulse to READ_R 329. If BLe 305 is discharged to a relatively low voltage level, node QA 331 will maintain its '1' value, previously obtained upon initial reset. However, if BLe 305 is not discharged due to a failed erase condition for one or more memory cells, node QA 331 may obtain a value of '0' due to the relatively high voltage level on SO 345 and due to the pulse on READ_R 329, thereby coupling node QA 331 to ground. Node QA# 333 would achieve a value of '1' in such a case.

A pre-charge phase for BLo 307 may include delivering a relatively low voltage level to PRECH 311, a relatively high voltage level to PBSENSE 309, a relatively high voltage level to BSLo 303, a '0' to DISCHo, a '0' to VIRPWR, and a '1' to DISCHe. The pre-charge phase for BLo 307 may be followed by an evaluation phase for BLo 307. For an embodiment, the evaluation phase may comprise applying a '0' to PBSENSE 309 and a '0' to BSLo 303. If the memory cells associated with BLo 307 are erased, BLo 307 will be discharged to a relatively low voltage level. If any memory cell is not erased, BLo 307 will remain at a relatively high voltage level, and this condition would indicate a failed erase operation.

A sensing phase for BLo 307 may comprise asserting BSLo 303 and PBSENSE 309, as well as applying a pulse to READ_R 329. BSLe 301 for this sensing phase is at logical '0'. If BLo 307 is discharged to a relatively low voltage level, node QA 331 will maintain its current value. However, if BLo 307 is not discharged due to a failed erase condition for one or more memory cells, node QA 331 may obtain a value of '0' due to the relatively high voltage level on SO 345 and due to the pulse on READ_R 329, thereby coupling node QA 331 to ground. Node QA# 333 would achieve a value of '1' in such a case. Note that if QA 331 was previously pulled to '0' during the sensing phase for BLe 305, that value of '0' is maintained if BLo 307 is not discharged. A value of '0' on QA 331 for the present example indicates a failed erase condition on one or more of bit lines BLe 305 and BLo 307. A value of '1' indicates an erased condition for both bit-lines.

For one or more embodiments, the value stored at latch 392 may be transferred to latch 390 in a manner such that the resulting value at latch 390 represents at one logical level a failed erase condition and represents at another logical level an erased condition for both BLe 305 and BLo 307 or a redunded page buffer. Recall that for the present example, it may be assumed that page buffer 300 is not a redunded buffer, and that a '0' was previously applied to DI 321 and a '1' was presented to nDI 323, resulting in values of '1' and '0' on nodes QB# 319 and QB 317, respectively. In the case of a redunded page buffer, values of '1' and '0' would have been presented to DI 321 and nDI 323, resulting in values of '1' and '0' on nodes QB 317 and QB#319, respectively. In the case of a redunded page buffer, the value stored at latch 392 would not result in any change of state at latch 390. However, if page buffer 300 is not redunded, as is assumed in the present example, the value of latch 392 may result in a change of state at latch 390 upon the transfer of the value of latch 392 to latch 390.

Because for this example page buffer 300 is not a redunded page buffer, the value at QB 317 is '0' as a result of the data insertion phase, noted previously. The value at node QB# 319 is '1'. In transferring the value at latch 392 to latch 390, a logical '1' may be applied to PDUMP 335. PBSENSE 309 is at '0' for this phase, in this example, and PROGRAM 315 is also at '0'. If the value at node QA 331 is a '1', indicating an erased condition for both bit-lines 305 and 307, a pulse on READ_L 313 may result in node QB# 319 being pulled to ground, and a value of '1' may result on node QB 317.

With a value of '1' on node QB 317, nWDO 275 is not pulled to the logically high voltage level, indicating a pass condition for the erase operation for page buffer 300. As previously indicated, if all such page buffers do not pull nWDO 275 to the logically high voltage level, an assertion of Check 273 will pull nWDO 275 to a logically low voltage level, and Pass 271 will become asserted, communicating that the previously executed erase operation was successful.

On the other hand, if the value at node QA 331 is a '0', indicating that one or more memory cells are not erased, a pulse on READ_L 313 will not pull node QB# 319 to ground, because node SO 345 will not turn on the transistor in series with the READ_R transistor. Therefore, the current value on nodes QB# 319 and QB 317 are not altered. Note that as a result of the data insertion phase, and because page buffer 300 is assumed to be non-redunded, node QB 311 has a value of 0.

With a value of '0' on node QB 317, nWDO 275 is pulled to the logically high voltage level, indicating a fail condition for the erase operation for page buffer 300. As previously indicated, if any such page buffer pulls nWDO 275 to the logically high voltage level, an assertion of Check 273 will result in a negation of Pass 271, communicating that the previously executed erase operation was not successful.

FIG. 4 is a schematic diagram of an alternative example flash memory page buffer 400. Page buffer 400, for one or more embodiments, may be used in any situation that page buffer 300 may be used, as described previously. For the present example, page buffer 400 is associated with two bit lines, BLe 405 and BLo 307. Page buffer 400 comprises three latches, latch 490, latch 494, and latch 492, depicted left-to-right in FIG. 4. To perform an erase verification operation, page buffer 400 operates in much the same way as example page buffer 300, described previously. However, for the present example, data insertion is accomplished at latch 492, while node nWDO 275 is associated with latch 490. For an example embodiment, a data insertion phase may result in a value of '1' on node QA 431 if page buffer 400 is a redunded page buffer, and a value of '0' if the page buffer is not redunded. Readings from the bit-lines 405 and 407 may result in a value of '0' on node QB 417 for completely erased memory cells, and a value of '1' if one or more memory cells are not erased.

For the present example embodiment, in response to completing the bit-line sense and data input phases, data stored in latch 490 may need to be inverted. This may be accomplished for an embodiment by moving the value stored at latch 492 to latch 494. As a result of the data insertion phase, node QA 431 may have a value of '1' for a redunded page buffer and '0' for a non-redunded page buffer. Node QC 453 will see identical values after the non-inverting transfer to the central latch. Further, data stored at latch 490 may be transferred to latch 492, at least in part by previously resetting values in the destination latch after having moved redundancy information from latch 492 to the central latch 494 with the above described non-inverting transfer. So, as a result of an assertion of RESET_R 427, node QA# 433 is pulled to '0', and a value of '1' results at node QA 431. A transfer of the values from latch 490, noted above, to latch 492 has the effect of inverting the values, such that the value at node QA 431 is '1' for completely erased memory cells, and a value of '0' for one or more non-erased memory cells.

A resetting of node QB 417 through an assertion of RESET_L 425 and then a passing of the values at latch 492 to latch 490 through latch 494 results in a value of '1' at node QB 417 for a redunded page buffer, a value of '1' for completely erased memory cells, and a value of '0' for one or more non-erased memory cells. For the present example embodiment, a value of '0' at node QB 417 results in node nWDO 275 being pulled to the logically high voltage level, indicating a failed erase condition for page buffer 400. Alternatively, a value of '1' at node QB 417 does not result in node nWDO 275 being pulled high, indicating a successful erase condition for page buffer 400. As with the previous example embodiments, if all such page buffers indicate successful erase conditions, node nWDO 275 is pulled to a logically low voltage level upon an assertion of signal Check 273, and Pass 271 becomes asserted, communicating a successful erase operation.

FIG. 5 is a schematic diagram of an additional example flash memory page buffer 500 including a latch 590 and a latch 592, with data insertion occurring at latch 592 and with node nWDO 275 associated with latch 590. For an example embodiment, in order to utilize latches 590 and 592 to perform erase verification operations, bit-lines 505 and 507 may be used to temporarily store information from one or more of the latches. A specific example is described below. However, as with other specific examples described herein, the scope of claimed subject matter is not limited to the specific details described.

An initial reset phase of the erase verification operation may begin for an example embodiment by asserting RESET_L 525, resulting in node QB 517 being pulled to logical '0'. Node QB# 519 is driven to a logical '1'.

A pre-charge phase for BLe 505 may include delivering a relatively low voltage level to PRECH 511, a relatively high voltage level to PBSENSE 509, a relatively high voltage level to BSLe 501, a '0' to DISCHe, a '0' to VIRPWR, and a '1' to DISCHo. During the pre-charge phase, data may be input to latch 592. Node YB 543 has a value of '0' for selected page buffers in accordance with column decoding. For the present example embodiment, assume that page buffer 500 is not a redunded buffer, but that page buffer 500 and its associated memory cells and bit-lines are assumed to be operational. In the case of a non-redunded page buffer, a '0' is presented to DI 521 and a '1' is presented to nDI 523, resulting in values of '1' and '0' on nodes QA# 533 and QA 531, respectively. In the case of a redunded page buffer, values of '1' and '0' may be presented to DI 521 and nDI 523, resulting in values of '1' and '0' on nodes QA 531 and QA# 533, respectively.

For an embodiment, an evaluation phase may comprise applying a '0' to PBSENSE 509 and a '0' to BSLe 501. If the memory cells associated with BLe 505 are erased, BLe 505 will be discharged to a relatively low voltage level. If any memory cell is not erased, BLe 505 will remain at a relatively high voltage level, and this condition would indicate a failed erase operation.

A sensing phase for BLe 505 may comprise asserting BSLe 501 and PBSENSE 509, as well as applying a pulse to READ_L 513. If BLe 505 is discharged to a relatively low voltage level, node QB 517 will maintain its '0' value, previously obtained upon initial reset. However, if BLe 505 is not discharged due to a failed erase condition for one or more memory cells, node QB 517 may obtain a value of '1' due to the relatively high voltage level on SO 545 and due to the pulse on READ_L 513, thereby coupling node QB# 519 to ground.

A pre-charge phase for BLo 507 may include delivering a relatively low voltage level to PRECH 511, a relatively high voltage level to PBSENSE 509, a relatively high voltage level to BSLo 503, a '0' to DISCHo, a '0' to VIRPWR, and a '1' to DISCHe. The pre-charge phase for BLo 507 may be followed by an evaluation phase for BLo 507. For an embodiment, the evaluation phase may comprise applying a '0' to PBSENSE 509 and a '0' to BSLo 503. If the memory cells associated with BLo 507 are erased, BLo 507 will be discharged to a relatively low voltage level. If any memory cell is not erased, BLo 507 will remain at a relatively high voltage level, and this condition would indicate a failed erase operation.

A sensing phase for BLo 507 may comprise asserting BSLo 503 and PBSENSE 509, as well as applying a pulse to READ_L 513. BSLe 501 for this sensing phase is at logical '0'. If BLo 507 is discharged to a relatively low voltage level, node QB 517 will maintain its current value. However, if BLo 507 is not discharged due to a failed erase condition for one or more memory cells, node QB 517 may obtain a value of '1' due to the relatively high voltage level on SO 345 and due to the pulse on READ_L 513, thereby coupling node QB# 519 to ground. A value of '1' on QB 517 for the present example indicates a failed erase condition on one or more of bit lines BLe 505 and BLo 507. A value of '0' indicates an erased condition for both bit-lines.

For one or more embodiments, the value stored at latch 590 may be transferred to BLe 505 for example. To achieve this, BLe 505 may be pre-charged in the manner described above, and data from latch 590 may then be transferred to BLe 505 by asserting PROGRAM 515, PBSENSE 509, and BSLe 510. DISCHe and VIRPWR may be at '0', while BSLo 503 is also at '0' and DISCHo is at '1'. In such a manner node QB carrying a logical '0' value may cause BLe 505 to discharge. Conversely, a logical '1' at node QB 517 may cause BLe 505 to remain at the pre-charged value.

Node QB 517 may be reset through an assertion of RESET_L 525, and the value from latch 592 may be transferred to latch 590. This may be accomplished with a pre-charge of SO node 545, an assertion of PDUMP 535, and a pulse on READ_L 513. If node QA 531 has a value of '1', node QB# 519 is pulled to '0', and a value of '1' appears on node QB 517. A value of '1' on QB 517 for this example would indicate a redunded page buffer, and a '0' would indicate a non-redunded page buffer.

For an embodiment, node QA# 533 may be reset with an assertion of RESET_R 527, resulting in a value of '1' on node QA 531. BLe 505, holding the previous bit-line read results from latch 590, may be sensed by asserting BSLe 501 and PBSENSE 509. A value of '1' on BLe 505, indicating a non-erased memory cell, may cause node QA 531 to be pulled to '0' upon a pulse of READ_R 529. A value of '0' on BLe 505 would result in the current value of node QA 531 remaining unchanged. QA 531 would retain a value of '1' in the case of completely erased memory cells for both bit-lines At least in part in response to completing the sensing of BLe 505, the value from latch 592 may be transferred to latch 590 by previously pre-charging SO 545 and then an assertion of PDUMP 535. A value of '1' on node QA 531 would result in node QB# 519 being pulled to '0' upon a pulse of READ_L 513, and a value of '1' would result at node QB 517. At this time node QB 517 stores both redundancy information of that page buffer and results of the two readings of all memory cells connected to the page buffer through BLe 505 and BLo 507.

With a value of '1' on node QB 517, nWDO 275 is not pulled to the logically high voltage level, indicating a pass condition for the erase operation for page buffer 500. As previously indicated, if all such page buffers do not pull nWDO 275 to the logically high voltage level, an assertion of Check 273 will pull nWDO 275 to a logically low voltage level, and Pass 271 will become asserted, communicating that the previously executed erase operation was successful.

Figure 6:
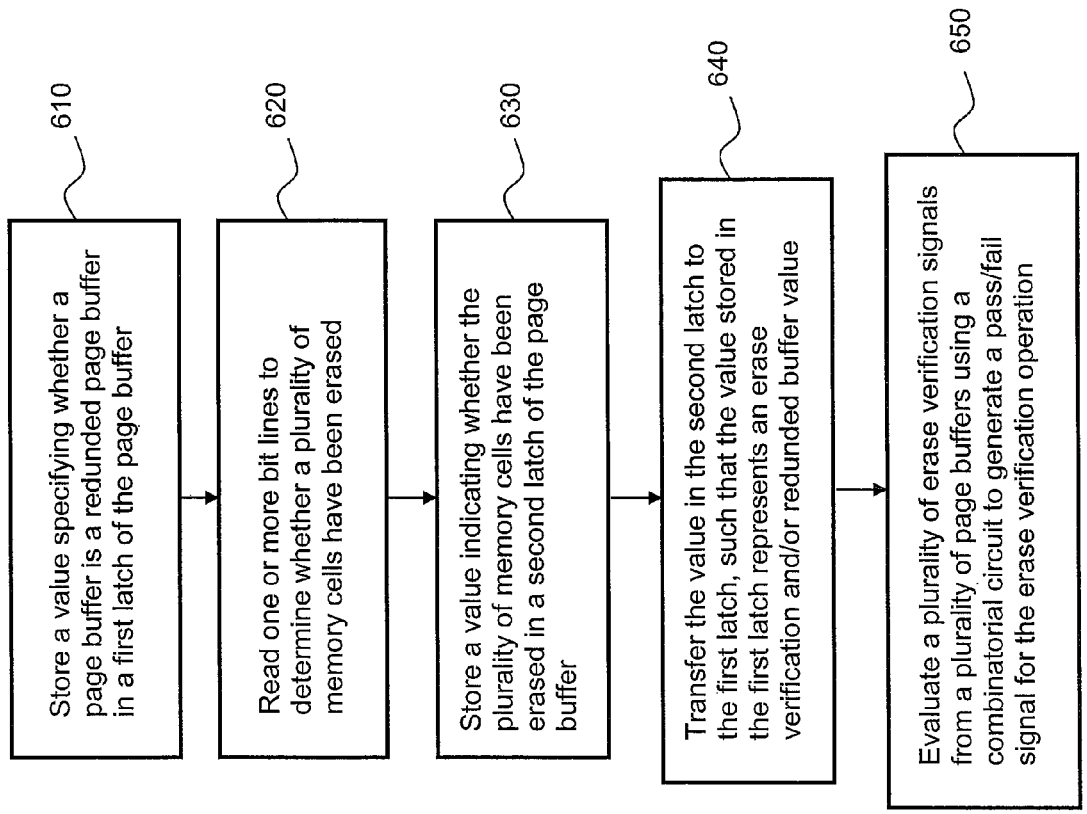
FIG. 6 is a flow diagram of an example embodiment of a method for erase operation verification for a flash memory device.

FIG. 6 is a flow diagram of an example embodiment of a method for erase operation verification for a flash memory device. At block 610, a value specifying whether a page buffer is a redunded page buffer may be stored in a first latch of the page buffer. At block 620, one or more bit-lines may be read to determine whether a plurality of memory cells have been erased, and at block 630 a value indicating whether the plurality of memory cells have been erased may be stored in a second latch of the page buffer. As indicated at block 640, the value stored in the second latch may be transferred to the first latch, such that the value stored in the first latch represents an erase verification and/or redunded buffer value. At block 650, a plurality of erase verification signals from a plurality of page buffers may be evaluated using a combinatorial circuit to generate a pass/fail signal for the erase verification operation. Of course, embodiments in accordance with claimed subject matter may include all, less than, or more than blocks 610 through 650. Also, the order of the blocks is merely an example order, and the scope of claimed subject matter is not limited in this respect.

In the preceding description, various aspects of claimed subject matter have been described. For purposes of explanation, systems or configurations were set forth to provide an understanding of claimed subject matter. However, claimed subject matter may be practiced without those specific details. In other instances, well-known features were omitted or simplified so as not to obscure claimed subject matter. While certain features have been illustrated or described herein, many modifications, substitutions, changes or equivalents will now occur to those skilled in the art. It is, therefore, to be understood that the appended claims are intended to cover all such modifications or changes as fall within the true spirit of claimed subject matter.

The invention claimed is:

1. A method, comprising:
   verifying an erase operation for a flash memory device using, at least in part, a program operation verification circuit within the flash memory device, the flash memory device to perform a command for erasing one or more blocks located in one or more planes and a separate command for erase verifying one or more blocks located in one or more planes, wherein said verifying the erase operation further comprises latching a first signal at a first latch of a first page buffer of a plurality of page buffers, the first signal to indicate whether the page buffer comprises a redunded page buffer.

2. The method of claim 1, wherein said verifying the erase operation comprises receiving a plurality of signals from the plurality of page buffers at a combinatorial logic circuit, and generating an output signal indicating a pass/fail condition using the combinatorial logic circuit based, at least in part, on the plurality of signals from the plurality of page buffers.

3. The method of claim 2, wherein said plurality of signals from the plurality of page buffers comprise a plurality of erase verification signals indicating, at least in part, whether a plurality of memory cells associated with the plurality of page buffers have been successfully erased.

4. The method of claim 1, wherein said verifying the erase operation further comprises:
   determining whether a plurality of memory cells associated with one or more bit lines associated with the first page buffer are erased and storing a second signal indicative of the results of the determination in a second latch of the first page buffer;
   transferring the second signal from the second latch to the first latch, the second signal to overwrite the first signal stored at the first latch at least in part in response to the second signal indicating that the plurality of memory cells associated with the one or more bit lines associated with the first page buffer are erased; and
   generating an erase verification signal associated with the first page buffer at least in part in response to the second signal overwriting the first signal at the first latch.

5. The method of claim 1, wherein said verifying the erase operation further comprises:
   determining whether a plurality of memory cells associated with one or more bit lines associated with the first page buffer are erased and storing a second signal indicative of the results of the determination in a second latch of the first page buffer;
   transferring the second signal from the second latch to a first bit line of the one or more bit lines;
   resetting the second latch;
   transferring the first signal stored at the first latch to the second latch;
   resetting the first latch;
   transferring the second signal from the first bit line to the first latch;
   transferring the second signal from the first latch to the second latch, the second signal from the first latch to overwrite the first signal stored at the second latch at least in part in response to the second signal indicating that the plurality of memory cells associated with the one or more bit lines are erased; and
   generating an erase verification signal associated with the first page buffer at least in part in response to the second latch storing the second signal indicating that the plurality of memory cells are erased.

6. The method of claim 1, wherein said verifying the erase operation further comprises:
   determining whether one or more memory cells associated with one or more bit lines associated with the first page buffer are erased and storing a second signal indicative of the results of the determination in a second latch of the first page buffer;
   transferring the first signal stored at the first latch to a third latch;
   resetting the first latch;
   transferring the second signal stored at the second latch to the first latch;
   resetting the second latch;
   transferring the first signal stored in the third latch to the second latch;

transferring the second signal stored at the first latch to the second latch, the second signal to overwrite the first signal stored at the second latch at least in part in response to the second signal indicating that the plurality of memory cells associated with the one or more bit lines are erased; and generating an erase verification signal associated with the first page buffer at least in part in response to the second latch storing the second signal indicating that the plurality of memory cells are erased.

7. A flash memory device, comprising:

a program operation verification circuit to verify, at least in part, an erase operation; and a first page buffer of a plurality of page buffers, the first page buffer including a first latch to latch a first signal indicative of whether the first page buffer comprises a redunded page buffer, the flash memory device further to perform a command for erasing one or more blocks of memory cells located in one or more planes and a separate command for erase verifying one or more blocks of memory cells located in one or more planes.

8. The memory device of claim 7, the plurality of page buffers to generate a plurality of erase verification signals, wherein the program operation verification circuit comprises a combinatorial logic circuit to receive the plurality of erase verification signals, the combinatorial circuit further to generate an output signal indicating a pass/fail condition based, at least in part, on the plurality of erase verification signals.

9. The memory device of claim 8, the plurality of erase verification signals to indicate, at least in part, whether a plurality of memory cells associated with the plurality of page buffers have been successfully erased.

10. The memory device of claim 7, wherein the first page buffer further comprises a second latch coupled to the first latch, the second latch to store a second signal indicative of whether a plurality of memory cells associated with one or more bit lines associated with the first page buffer are erase, the second signal stored at the second latch to be transferred to the first latch, the second signal to overwrite the first signal stored at the first latch at least in part in response to the second signal indicating that the plurality of memory cells associated with the one or more bit lines are erased, the first page buffer to generate an erase verification signal at least in part in response to the first latch storing the second signal from the second latch indicating that the plurality of memory cells are erased.

11. The memory device of claim 7, wherein the first page buffer further comprises a second latch coupled to the first latch, the second latch to store a signal indicative of whether a plurality of memory cells associated with one or more bit lines associated with the first page buffer are erased the results of the determination, the second signal stored at the second latch to be transferred to a first bit line of the one or more bit lines, the second latch to be reset, the first signal stored at the first latch to be transferred to the second latch, the first latch to be reset, the second signal stored at the first bit line to be transferred to the first latch, the second signal stored at the first latch to be transferred to the second latch, the second signal from the first latch to overwrite the first signal stored at the second latch at least in part in response to the second signal indicating that the plurality of memory cells associated with the one or more bit lines are erased, the first page buffer to generate an erase verification signal at least in part in response to the second latch storing the second signal from the first latch indicating that the plurality of memory cells are erased.

12. The memory device of claim 7, wherein the first page buffer further comprises a second latch and a third latch coupled to the first latch, the second latch to store a second signal indicative of whether a plurality of memory cells associated with one or more bit lines associated with the first page buffer are erased, the first signal stored at the first latch to be transferred to the third latch, the first latch to be reset, the second signal stored at the second latch to be transferred to the first latch, the second latch to be reset, the first signal stored at third latch to be transferred to the second latch, the second signal stored at the first latch to be transferred to the second latch, the second signal to overwrite the first signal stored at the second latch at least in part in response to the second signal indicating that the plurality of memory cells associated with the one or more bit lines are erased, the first page buffer to generate an erase verification signal at least in part in response to the second latch storing the second signal indicating that the plurality of memory cells are erased.

13. A system, comprising:

a processor; and a flash memory device coupled to the processor, the memory device comprising a program operation verification circuit adapted to verify, at least in part, an erase operation; and a first page buffer of a plurality of page buffers, the first page buffer including a first latch to latch a first signal indicative of whether the first page buffer comprises a redunded page buffer, the flash memory device further adapted to perform a command for erasing one or more blocks located in one or more planes and a separate command for erase verifying one or more blocks located in one or more planes.

14. The system of claim 13, the plurality of page buffers to generate a plurality of erase verification signals, wherein the program operation verification circuit comprises a combinatorial logic circuit to receive the plurality of erase verification signals, the combinatorial circuit further to generate an output signal indicating a pass/fail condition based, at least in part, on the plurality of erase verification signals.

15. The system of claim 14, the plurality of erase verification signals to indicate, at least in part, whether a plurality of memory cells associated with the plurality of page buffers have been successfully erased.

16. The system of claim 13, wherein the first page buffer further comprises a second latch coupled to the first latch, the second latch to store a second signal indicative of whether a plurality of memory cells associated with one or more bit lines associated with the first page buffer are erased, the second signal stored at the second latch to be transferred to the first latch, the second signal to overwrite the first signal stored at the first latch at least in part in response to the second signal indicating that the plurality of memory cells associated with the one or more bit lines are erased, the first page buffer to generate an erase verification signal at least in part in response to the first latch storing the second signal indicating that the memory cells are erased.

17. The system of claim 13, wherein the first page buffer further comprises a second latch coupled to the first latch, the second latch to store a second signal indicative of whether a plurality of memory cells associated with one or more bit lines associated with the first page buffer are erased, the second signal stored at the second latch to be transferred to a first bit line of the one or more bit lines, the second latch to be reset, the first signal stored at the first latch to be transferred to the second latch, the first latch to be reset, the second signal stored at the first bit line to be transferred to the first latch, the second signal stored at the first latch to be transferred to the second latch, the second signal to overwrite the first signal stored at the second latch at least in part in response to the second signal indicating that the plurality of memory cells associated with the one or more bit lines are erased, the first page buffer to generate an erase verification signal at least in part in response to the second latch storing the second signal indicating that the memory cells are erased.

18. The system of claim 13, wherein the first page buffer further comprises a second latch and a third latch coupled to the first latch, the second latch to store a second signal indicative of whether a plurality of memory cells associated with one or more bit lines associated with the first page buffer are erased, the first signal stored at the first latch to be transferred to the third latch, the first latch to be reset, the second signal stored at the second latch to be transferred to the first latch, the second latch to be reset, the first signal stored at third latch to be transferred to the second latch, the second signal stored at the first latch to be transferred to the second latch, the second signal to overwrite the first signal stored at the second latch at least in part in response to the second signal indicating that the plurality of memory cells associated with the one or more bit lines are erased, the first page buffer to generate an erase verification signal at least in part in response to the second latch storing the second signal indicating that the plurality of memory cells are erased.

* * * * *